United States Patent [19]

Samukawa et al.

[11] Patent Number: 5,565,302

[45] Date of Patent: Oct. 15, 1996

[54] PROCESS FOR PREPARING PHOTOSENSITIVE RESIN COMPOSITION

[75] Inventors: Hiroshi Samukawa; Katsue Nishikawa; Yoshichi Hagiwara, all of Kanagawa-ken, Japan

[73] Assignee: W. R. Grace & Co.-Conn., New York, N.Y.

[21] Appl. No.: 426,369

[22] Filed: Apr. 21, 1995

[51] Int. Cl.$^6$ .............................. G03F 7/028; G03F 7/033
[52] U.S. Cl. ......................... 430/281.1; 430/910; 522/85
[58] Field of Search ................................ 430/281, 270, 430/910, 281.1; 522/85

[56] References Cited

U.S. PATENT DOCUMENTS

| | | | |
|---|---|---|---|
| 3,887,450 | 6/1975 | Gilano et al. | 430/281 |
| 5,045,435 | 9/1991 | Adams et al. | 430/288 |
| 5,364,737 | 11/1994 | Barr | 430/910 X |
| 5,387,494 | 2/1995 | Barr et al. | 430/281 |
| 5,389,495 | 2/1995 | Barr | 430/910 X |

FOREIGN PATENT DOCUMENTS

| | | |
|---|---|---|
| 54-91585 | 3/1979 | Japan . |
| 64-62634 | 7/1989 | Japan . |

OTHER PUBLICATIONS

Todd et al, "Aqueous Photopolymerisable Coating Compositions", *Research Disclosure*, No. 18218, Jun. 1979 pp. 300–301.

Chiou et al, "Emulsified Photoresist for Printed Circuit Imaging", MRL Bull. Res. Dev., vol. 2, No. 2 (1988) pp. (13–17).

Brochure for "Aqualine" by Coates ASI.

*Primary Examiner*—Cynthia Hamilton
*Attorney, Agent, or Firm*—Howard J. Troffkin

[57] ABSTRACT

The present invention provides a process of preparing a waterborne photosensitive resin composition, free of organic solvent, that can be developed with aqueous alkali solution. The method of the present invention is a process for preparing a waterborne photosensitive resin composition, that can form a photosensitive article developable with aqueous alkali solution, by adding an unsaturated compound, a surfactant and a photoinitiator to an aqueous emulsion, and agitating under conditions sufficient to absorb the unsaturated compound into the polymeric particles of the emulsion and to form a stable waterborne photosensitive resin composition.

4 Claims, No Drawings

PROCESS FOR PREPARING PHOTOSENSITIVE RESIN COMPOSITION

FIELD OF THE INVENTION

This invention relates to a process for preparing a waterborne photosensitive resin composition. More particularly, this invention relates to a process for preparing a waterborne photosensitive resin composition developable with aqueous alkali solution.

BACKGROUND OF THE INVENTION

Typically, photosensitive articles such as photoresists are prepared using a photosensitive resin solution or film as the resist material. Conventional photosensitive resins are available as solutions prepared in organic solvents or in the form of film produced from such solutions (in organic solvent).

Organic solvents have also been used in the past in the development process following exposure to light. In recent years, in response to health, safety and environmental concerns, diluted aqueous alkaline solutions have replaced organic solvents as the developer solutions. However, health, safety and environmental concerns remain to the extent that organic solvents are still used in the resin solution, because it is still not possible to avoid evaporation of the organic solvent during coating of the resist, drying of the coated resist, or processing into a film.

In Japanese Kokai Patent, SHO 54-91585 (1979), an attempt was made to address these problems using a photosensitive resin composition made of a water-dispersible latex and water-soluble (or water-dispersible) unsaturated compound. However, such a system is undesirable due to the risks associated with working in aqueous systems during etching or plating operations because of the high hydrophilic property of the water-soluble unsaturated compound. Therefore, use of a water-insoluble unsaturated compound is preferred. It has been, however, difficult to mix the water-insoluble unsaturated compound stably with a water-dispersible latex.

In U.S. Pat. No. 5,045,435, the aforementioned problems were addressed by neutralizing a part of the acid of the water-insoluble carboxylated(meth) acrylate latex with inorganic alkali or amines, to stabilize the composition and perform rheological adjustment during coating. Although a stable composition can be obtained by such method, the use of such a composition is undesirable due to the production of noxious fumes during resist preparation due to vaporization of amines and the effect that inorganic alkali can have on electronic equipment.

It is, therefore, a general object of the present invention to provide a process for preparing a waterborne photosensitive resin composition, that provides a stable mixture of an aqueous polymer emulsion and a water-insoluble unsaturated compound.

It is a further object of the present invention to provide a waterborne photosensitive resin composition, that when used to make a resist film, avoids the risks associated with organic solvents such as splashing during resist processing.

SUMMARY OF THE INVENTION

The present invention provides a process of preparing a waterborne photosensitive resin composition, free of organic solvent, that can be developed with aqueous alkali solution.

The method of the present invention is a process for preparing a waterborne photosensitive resin composition, that can form a photosensitive article developable with aqueous alkali solution, the process comprising, (1) adding to an aqueous polymer emulsion (a), an unsaturated compound (b) and a surfactant, (2) agitating under conditions sufficient to absorb compound (b) into the polymeric particles of emulsion (a), and (3) adding a photoinitiator (c), to form a stable waterborne photosensitive resin composition, wherein said emulsion (a) is an aqueous emulsion of a polymer compound having an acid value of about 80–250 mg-KOH/g and a glass transition temperature of about 50°–200° C. and having at least one carboxyl group, and wherein said compound (b) is a compound having at least one ethylenically unsaturated bond, and wherein said photoinitiator (c) is a photoinitiator capable of generating free radicals by irradiation with actinic light.

In the present invention, the surfactant is added by any other suitable means to effect dispersion of unsaturated compound (b) in the aqueous emulsion (a), as contemplated in alternative embodiments. As contemplated, the surfactant may be added in any way that effects dispersion of the unsaturated compound, including, for example, by first mixing the surfactant in water and then combining with the unsaturated compound, after which the water dispersed unsaturated compound may be added to the aqueous emulsion, or mixing the surfactant in the aqueous emulsion of polymeric compound and then adding the unsaturated compound to the emulsion.

The present invention also contemplates compositions made by the aforementioned processes, photosensitive articles made therefrom and processes for making said articles.

DETAILED DESCRIPTION

In accordance with the invention, the present inventors have discovered that the water-insoluble unsaturated compound capable of exhibiting an outstanding property after curing can be mixed stably in an aqueous emulsion by adding a compound, having at least one ethylenically unsaturated bond, and a surfactant to the aqueous emulsion. Furthermore, the present inventors have discovered that, in the case of adding the surfactant and the compound having at least one ethylenically unsaturated bond (hereinafter "unsaturated compound") to their aqueous emulsion (of polymeric compound having an acid value of about 80–250 mg-KOH/g and a glass transition temperature of about 50°–200° C., and having at least one carboxyl group), the unsaturated compound was absorbed into the polymer particles of the aqueous emulsion to form a stable emulsion. The present inventors also found that when the unsaturated compound was first dispersed in water using a surfactant and then added to the aqueous emulsion, the thus-formed emulsion showed an outstanding film formability.

Thus, in one embodiment, the present invention is a process for preparing a waterborne photosensitive resin composition, that can form a photosensitive article developable with aqueous alkali solution, the process comprising, (1) adding to an aqueous polymer emulsion (a), an unsaturated compound (b) and a surfactant, (2) agitating under conditions sufficient to absorb compound (b) into the polymeric particles of emulsion (a), and (3) adding a photoinitiator (c), to form a stable waterborne photosensitive resin composition, wherein said emulsion (a) is an aqueous emulsion of a polymeric compound having an acid value of about 80–250 mg-KOH/g and a glass transition temperature of about 50°–200° C. and having at least one carboxyl group, wherein said compound (b) is a compound having at least one ethylenically unsaturated bond, and wherein said photoinitiator (c) is a photoinitiator capable of generating free radicals by irradiation with actinic light.

In another embodiment, the present invention is a process for preparing a waterborne photosensitive resin composition, that can form a photosensitive article developable with aqueous alkali solution, the process comprising, (1) dispersing an unsaturated compound (b) in water with a surfactant, (2) adding to an aqueous emulsion (a), said water-dispersed unsaturated compound (b), (3) agitating under conditions sufficient to absorb compound (b) into the polymeric particles of emulsion (a), and (4) adding a photoinitiator (c), to form a stable waterborne photosensitive resin composition, wherein said emulsion (a) is an aqueous emulsion of a polymeric compound having an acid value of about 80–250 mg-KOH/g and a glass transition temperature of about 50°–200° C. and having at least one carboxyl group, wherein said compound (b) is a compound having at least one ethylenically unsaturated bond, and wherein said photoinitiator (c) is a photoinitiator capable of generating free radicals by irradiation with actinic light.

Photoinitiator (c) may be added, in the preparation of the waterborne photosensitive resin composition, at any suitable point during the process of the invention. Therefore, for example, the photoinitiator may be added to the unsaturated compound ahead of time, added together with the unsaturated compound and surfactant in the aqueous emulsion, added together with the unsaturated compound and surfactant to form an aqueous dispersion (which is then added to the aqueous emulsion), or added to an aqueous dispersion of the unsaturated compound and surfactant.

Accordingly, in an alternative embodiment, the process of the present invention comprises, (1) mixing an unsaturated compound (b) with a photoinitiator (c), (2) adding to the aqueous polymer emulsion (a), the mixture of compound (b) and photoinitiator (c) and a surfactant, and (3) agitating under conditions sufficient to absorb compound (b) into the polymeric particles of emulsion (a), to form a stable waterborne photosensitive resin composition, wherein components (a), (b) and (c) are as described above.

In yet another alternative embodiment, the process of the present invention comprises (1) mixing an unsaturated compound (b) with a photoinitiator (c), (2) dispersing the mixture of compound (b) and photoinitiator (c) in water with a surfactant, (3) adding to an aqueous emulsion (a), the water-dispersed mixture of compound (b) and photoinitiator (c), and (4) agitating under conditions sufficient to absorb compound (b) into the polymeric particles of emulsion (a), to form a stable waterborne photosensitive resin composition, wherein components (a), (b), and (c) are as described above.

Component (a) may be obtained commercially or prepared by any suitable means.

It is possible to dissolve, disperse, suspend or emulsify the polymeric compound which is used to prepare component (a) to form an aqueous emulsion by using a surfactant, or "an emulsifier". It is preferred to polymerize a monomer having at least one carboxyl group and at least one double bond in the molecule with a monomer that can copolymerize with such monomer by using a method such as emulsion polymerization or suspension polymerization to form, an aqueous emulsion of polymeric compound, in order to obtain a more stable aqueous resin composition solution.

The monomer that has at least one carboxyl group and at least one double bond in the molecule, which is used in the preparation of the component (a) may be selected from acrylic acid, methacrylic acid, maleic acid, itaconic acid, crotonic acid, cinnamic acid, and the like. Two or more of such monomers may be mixed and used.

It is presently contemplated that the content of the carboxyl group in the formed polymeric compound, having at least one carboxyl group in the molecule, will be about 1.43–4.46 mmols per g.

Any suitable polymerizable monomers may be used as the other monomers that can copolymerize with the monomer that has at least one carboxyl group and at least one double bond in the molecule to be used for preparation of component (a) in the composition of this invention, including acrylic esters such as methyl acrylate and ethyl acrylate, methacrylic esters such as methyl methacrylate, ethyl methacrylate, n-butyl methacrylate, styrene, vinyl toluene, acrylamide, acrylonitrile, butadiene, and the like.

Component (a) may be prepared by any suitable means; emulsion polymerization or suspension polymerization, using conventional techniques, is preferred. In emulsion polymerization or suspension polymerization, the monomer, having at least one carboxyl group and at least one double bond in the molecule, and the other polymerizable comonomer are emulsified or suspended in water using a suitable anionic surfactant such as alkylsulfonates, alkylbenzene sulfonates, alkyldiphenyl ether disulfonates, naphthalene sulfonic acid/formalin condensation products, polyoxyethylene alkyl ether sulfate, and the like, or nonionic surfactants such as polyethyleneglycol ether or polyethylene sorbitan ester and the like. The monomers are then polymerized using a suitable water-soluble polymerization initiator such as potassium persulfate, hydrogen peroxide, or ammonium persulfate and the like. In order to increase the stability of the solution during and after the reaction, conventional additives known in the art may be added to the reaction mixture. Molecular weight of the polymer may be regulated by use of a suitable chain transfer agent such as 1-dodecane thiol or 3-dodecane thiol and the like.

In the present invention, the acid number of the polymeric compound, having at least one carboxyl group in the molecule, obtained by the above-described method is contemplated to be about 80–250 mg/g. If the acid number is lower than about 80 mg/g, it will be difficult to develop with aqueous alkali solution. On the other hand, if the acid number exceeds about 250 mg/g, it will diminish the properties of the resist film, such as water resistance or resistance to the etching solution.

In the present invention, it is contemplated that the glass transition temperature of the polymeric compound, having at least one carboxyl group, obtained by the above-mentioned method is about 50°–200° C. If the glass transition temperature is lower than about 50° C., the photosensitive composition will remain sticky even after coating and drying as a resist solution on a substrate, and will be unsuitable for contact with a negative mask for exposure to light. If the glass transition temperature is higher than about 200° C., it will be difficult to obtain a film on the substrate.

The particle size of the polymeric compound in said aqueous emulsion (a) is presently contemplated to be about 0.02–0.3 μm. This particle size is believed to be important in promoting absorption of the unsaturated compound in the polymeric emulsion particles without the use of an organic solvent. This provides an advantage over known techniques which require the use of an organic solvent such as acetone, that must be removed later.

Component (b) of the present invention, as contemplated, is a compound having at least one ethylenically unsaturated bond in the molecule; examples of which include, without limitation, the following: 2-hydroxyethyl acrylate, 2-hydroxypropyl acrylate, N-vinylpyrrolidone, acryloyl morpholine, methoxytetraethyleneglycol acrylate, methoxypolyethyleneglycol acrylate, polyethyleneglycol diacrylate, N,N-dimethyl acrylamide, N-methylol acrylamide, N,N-dimentylaminopropyl acrylamide, N,N-dimethylaminoethyl acrylate, N,N-dimethylaminopropyl acrylate, melamine acrylate, diethyleneglycol diacrylate, triethyleneglycol diacrylate, propyleneglycol diacrylate, dipropyleneglycol diacrylate, tripropyleneglycol diacrylate, polypropyleneglycol diacrylate, phenoxyethyl acrylate, tetrahydrofurfuryl acrylate, cyclohexyl acrylate, trimethylolpropane triacrylate, glycerin diglycidyl ether diacrylate, pentaerythritol triacrylate, pentaerythritol tetracrylate, pentaerythritol pentacrylate, pentaerythritol hexacrylate, isoborneolyl acrylate, cyclopentadiene mono and diacrylate, and methacrylates that correspond to the above-mentioned acrylates.

Component (c) of the present invention may be selected from any suitable photopolymerization initiator that can generate free radicals by irradiation with actinic light. Examples of component (c) include: quinones such as 2-ethyl anthraquinone, 2-t-butyl anthraquinone, octamethyl anthraquinone, and 1,2-benzanthraquinone; α-ketaldonyl alcohols or ethers such as benzoin, pivaloin, and acyloin ether; ketones such as α-phenyl benzoin, α,α'-diethoxy acetophenone, benzophenone, 4,4'-bisdialkylamino benzophenone; thioxanthone derivatives; 2,4,5-triaryl imidazolyl dimers and the like. These compounds can be used alone or as a mixture of two or more.

The photosensitive resin composition of this invention may also include polymerization inhibitors, known in the art, to prevent thermal polymerization during storage. Examples of suitable inhibitors include hydroquinone, hydroquinone monomethyl ether, pyrogallol, tertiary-butyl catechol, phenothiazine and the like.

The photosensitive resin composition of this invention may additionally include fillers such as barium sulfate, silicon oxide, talc, clay, and calcium carbonate; conventional coloring agents such as Phthalocyanin Green, titanium oxide, and carbon black; leveling agents; contact improving agents; thixotropic agents, and the like.

Preparation of the photosensitive resin composition of this invention can be carried out by adding and agitating the compound having at least one ethylenically unsaturated bond, described above, and the surfactant in the aqueous emulsion of polymeric compound having an acid value of about 80–250 mg-KOH/g and a glass transition temperature of about 50°–200° C., and having at least one carboxyl group prepared by the method described above, to disperse the unsaturated compound in the emulsion.

The surfactant used in preparing the photosensitive resin composition is in addition to any surfactant (or "emulsifiers") used in preparing the aqueous emulsion of polymeric compound. Although some of the surfactant used during the preparation of this polymeric compound may remain in the aqueous emulsion, it is believed that the majority of such surfactant (emulsifier) is adsorbed on the surface of the particles in the aqueous emulsion. Therefore, fresh surfactant must be added to the system to disperse the unsaturated compound. The use of excess surfactant during preparation of the aqueous emulsion of polymeric compound only results in decreasing the size of the emulsion particles and increasing the number of particles, thereby increasing the total surface area of the particles. Any excess surfactant will, therefore, be adsorbed on the additional particle surface area.

Any of the known surfactants such as anionic series, cationic series and nonionic series may be used as, (i) the surfactant to be added in the aqueous emulsion together with the unsaturated compound, and (ii) the surfactant used during preparation of the aqueous emulsion of polymeric compound. The surfactants used in the present invention for (i) and (ii), above, may be the same or different and may be used individually or as a mixture of two or more. The amount of surfactant contemplated for use in the present invention is about 0.1 weight %–15 weight %, and preferably about 1 weight %–6 weight %, based on the amount of the unsaturated compound to be added (i.e, for (i)). If the amount of surfactant is less than the specified range, stability of the dispersion will be insufficient, and if it exceeds the said range, it will cause an adverse effect on the water resistance of the final resist film.

As contemplated, the surfactant may be added in any way that effects dispersion of the unsaturated compound, including, but not limited to the following: (1) the surfactant may be first dissolved in water and then combined with the unsaturated compound, after which the water-dispersed unsaturated compound may be added to the aqueous emulsion, (2) the surfactant for dispersing the unsaturated compound may be dissolved in the aqueous emulsion of polymeric compound and then the unsaturated compound may be added to this emulsion, or (3) the surfactant may be added, together with the unsaturated compound, to the aqueous emulsion.

After adding the unsaturated compound and surfactant to the aqueous emulsion, the mixture is agitated under conditions sufficient to disperse the unsaturated compound in the aqueous emulsion and to maintain a dispersed state until the unsaturated compound is completely absorbed in the aqueous emulsion particles (without causing destruction of the particles in the aqueous emulsion). Normally, the time required to absorb the unsaturated compound in the aqueous emulsion particles is from about 5 minutes to 1 day at room temperature and about several minutes at 50°–100° C., although the time may differ with the type of aqueous emulsion being used.

If the photoinitiator is solid, it may be dissolved in the unsaturated compound first before converting it, together with the surfactant, into an aqueous dispersion form. If the photopolymerization initiator is a liquid, it may be added at any stages of the preparation of photosensitive resin composition, including for example, but not limited to: (a) adding to the unsaturated compound ahead of time, (b) adding together with unsaturated compound and surfactant in the aqueous emulsion, (c) adding to form a state of aqueous dispersion together with the unsaturated compound and surfactant, and (d) adding in an aqueous dispersion made of unsaturated compound and surfactant. The amount of photoinitiator contemplated is from about 0.5–15 weight %, and preferably from about 1–10 weight %, based on the total weight of solids in the resin composition.

It is contemplated that the amount of ethylenically unsaturated compound in the resin composition of the present invention is about 5–65 weight % of the solid content in the aqueous emulsion of polymeric compound. If the amount is less than this range, it will be difficult to obtain an uniform coated film after drying. On the other hand, if it exceeds this range, it will be sticky after drying and the coated film will be unsuitable for contact with a negative mask for exposure to light.

In a second embodiment of this invention, the method of this invention is characterized by including a process of dispersing the unsaturated compound, having at least one ethylenically unsaturated bond, with a surfactant in water and then adding this dispersion to the aqueous emulsion of polymeric compound having an acid value of about 80–250 mg-KOH/g and a glass transition temperature of about 50°–200° C., and having at least one carboxyl group. The dispersion may be promoted by the use of a homogenizer, ultrasonication, or the like.

The same surfactant used in the first embodiment can be used, at the same concentration, as the surfactant herein. To disperse the unsaturated compound, the surfactant may be dissolved first in water to a concentration of about 0.1–15 weight %, based on the amount of unsaturated compound to be added, and then the unsaturated compound may be added. The ratio (weight ratio) of water to unsaturated compound (water: unsaturated compound) is about 5/95–95/5.

The photoinitiator may be pre-dissolved (if solid) in the unsaturated compound prior to dispersion in water. The amount of photopolymerization initiator used is from about 0.5–15 weight %, based on the total solid content of the resin composition.

The photosensitive resin composition of this invention can, then, be prepared by adding the water-dispersed unsaturated compound into the aqueous emulsion of polymeric compound having an acid value of about 80–250 mg-KOH/g and a glass transition temperature of about 50°–200° C., and having at least one carboxyl group.

The advantages of dispersing the unsaturated compound in surfactant dissolved water using a homogenizer or ultrasonic wave, or the like, before adding it to the aqueous emulsion of polymeric compound, include the following:

(1) Because unsaturated compound can be absorbed in the aqueous emulsion particles without agitation or with only mild agitation, after mixing the dispersion of unsaturated compound with the aqueous emulsion of polymeric compound, destruction of the aqueous emulsion can be limited;

(2) Because unsaturated compound and aqueous emulsion are dispersed separately, they can be dispersed efficiently and quickly by using a high shear homogenizer, or the like;

(3) Excellent absorption efficiency and absorption can be achieved in a shorter period of time.

When the aqueous solution of the thus-obtained photosensitive resin composition was let stand for several weeks or longer, no precipitate, was formed.

According to the process of the present invention, of preparing a waterborne photosensitive resin composition, the problems and risks (i.e., splashing) associated with the use of organic solvents is avoided because no organic solvent is used. Also, since the water-insoluble unsaturated compound can be mixed stably, a photosensitive article can be prepared that bestows high etching resistance and platability.

In order to further illustrate the practice of the present invention and the advantages thereof, the following examples are provided. However, these examples are not intended to limit the scope of this invention in any way.

Example of Synthesis 1

Preparation of aqueous emulsion of emulsion polymer (EMO1)

Components used in this Example of Synthesis and ratio of the amounts of each components are shown in the following table. Surfactant, polyethyleneglycol nonylphenyl ether and sodium dodecylbenzenesulfonate and deionized water, was charged in a 500 ml separable flask equipped with an agitating device, a thermometer, a reflux condenser and a dropping funnel; and the temperature of the flask was raised to 75° C. Methyl methacrylate, butyl acrylate, methacrylic acid and 1-dodecanethiol were mixed, to prepare a monomer mixture. A portion (10 weight %) of this monomer mixture was added to the flask to disperse it. Then, a solution prepared by dissolving ammonium persulfate (APS, an initiator) 0.2 g in deionized water 6 g was added. The remaining portion of the monomer mixture was added dropwise from the dropping funnel over a period of about 2 hours. After completing addition of, the monomer, reaction was carried out at the same temperature for an additional 2 hours, to obtain a semi-transparent aqueous emulsion solution. This aqueous emulsion solution is called "EMO1".

| Component | Weight parts |
|---|---|
| Monomer | 100.0 (Breakdown) |
| Methyl methacrylate | (71.0) |
| Butyl acrylate | (9.0) |
| Methacrylic acid | (20.0) |
| 1-Dodecanethiol (chain transfer agent) | 0.1 |
| Polyethyleneglycol nonylphenyl ether (surface activating agent) (EMULGEN 920, Koa K.K.) | 2.0 |
| Sodium dodecylbenzene sulfonate | 2.0 |
| Deionized water | 390.0 |
| APS (ammonium persulfate) (initiator) | 0.2 |
| Deionized water to dissolve APS | 6.0 |

Examples of Synthesis 2–6

Preparation of aqueous polymer emulsions EM02, 03, 04, 05, and 06

Using the method described in Example of Synthesis 1, additional aqueous emulsions having a solid content of 25 weight %–40 weight % and having different acid values (A.V.) were prepared by changing the ratio of methacrylic acid (or acrylic acid); and aqueous emulsions having the same solid content but having different Tg were prepared by changing the ratio of butyl acrylate. Results are summarized in the following table.

Example of Synthesis 7

Aqueous emulsion EMO1' was prepared by the method of Example 1, except that twice the amount of surfactant was used.

| Weight composition ratio of monomers | Solid contents (%) | Tg (°C.) | External appearance | Particle Size (μm) |
|---|---|---|---|---|
| EM01 MMA/BA/MAA = 7/9/20 | 25 | 130 | White and semi-clear | 0.054 |
| EM02 MMA/BA/MAA = 58/12/30 | 25 | 196 | White and semi-clear | 0.060 |
| EM03 MMA/BA/MAA = 41.3/28.7/30 | 25 | 196 | White and semi-clear | 0.038 |
| EM04 MMA/BA/AA = 71/9/20 | 25 | 156 | White and semi-clear | 0.071 |
| EM05 MMA/BA/MAA = 65.5/10/24.5 | 40 | 160 | White and semi-clear | 0.045 |
| EM06 MMA/AA = 80/20 | 25 | 156 | White and semi-clear | 0.181 |
| EM01' MMA/BA/MAA = 71/9/20 | 25 | 130 | White and semi-clear | —* |

MMA: Methyl methacrylate, BA: butyl acrylate, MAA: methacrylic acid
AA: acrylic acid
*: not determined.

Example of Synthesis 8

Preparation of unsaturated compound dispersed solution (M1)

IRGACURE 651 and butylhydroxytoluene, at the ratios shown in the following table, were dissolved in ethoxylated trimethylolpropane triacrylate at 50° C., to prepare a part A1. Separately, two types of surfactant and antifoam agents, shown in the following table, were dissolved in deionized water, to prepare the part B. Then, part A1 and part B were mixed and agitated at a rotation speed of 8000 rpm for 1 minute using a homogenizer, to obtain a milky white dispersion. This dispersion is called "M1".

Dispersion (M1) of the compound having at least one ethylenically unsaturated bond (Example of Synthesis 8)

| | Weight Part |
|---|---|
| Part A1 | |
| Ethoxylated trimethylolpropane triacrylate (Shin Nakamura Kagaku K.K., A-TEMPT-3EO) | 50.0 |
| 2,2-Dimethoxy-2-2-phenyl acetophenone (photopolymerization initiator (Ciba-Geigy, IRGACURE 651) | 7.1 |
| Butylhydroxy toluene (polymerization inhibitor) | 40.7 |
| Part B | |
| Dionized water | 40.7 |
| Polyethyleneglycol nonphenyl ether (EMULGEN 920, a product of Koa K.K.) | 1.0 |
| Sodium dodecylbenzene sulfonate | 1.0 |
| Silicone antifoam, TSA750S (product of Toshiba Silicone K.K.) | 0.1 |

Examples of Synthesis 9–11

Preparation of unsaturated compound dispersed solutions (M2–M4)

Procedure of Example of Synthesis 8 was followed, except changing the part A1 to Parts A2–A4 shown in the following table while keeping the same part B, to prepare unsaturated compound dispersions (M2), (M3), and (M4). M2 and M3 were milky white. M4 was milky white with a faint yellow shade.

Dispersion M2 of the compound having at least one ethylenically unsaturated bond (Example of Synthesis 9)

| | Weight Parts |
|---|---|
| Part A2 | |
| Trimethylolpropane triacrylate (Shin Nakamura Kagaku K.K., A-TMPT) | 50.0 |
| 2,2-Dimethoxy-2-phenyl acetophenone (photopolymerization initiator (Ciba-Geigy, IRGACURE 651) | 7.1 |
| Butylhydroxy toluene (polymerization inhibitor) | 0.1 |

Dispersion M3 of the compound having at least one ethylenically unsaturated bond (Example of Synthesis 10)

| | Weight Parts |
|---|---|
| Part A3 | |
| Propoxylated trimethylol propane triacrylate (Shin Nakamura Kagaku K.K., A-TMPT-3PO) | 50.0 |
| 2,2-Dimethoxy-2-phenyl acetophenone (Photopolymerization initiator (Ciba-Geigy, IRGACURE 651) | 7.1 |
| Butylhydroxy toluene (polymerization inhibitor) | 0.1 |

Dispersion M4 of the compound having at least one ethylenically unsaturated bond (Example of Synthesis 11)

| | Weight Parts |
|---|---|
| Part A4 | |
| Ethoxylated trimethylolpropane triacrylate (Shin Nakamura Kagaku K.K., A-TMPT-3EO) | 50.0 |
| 2-Methyl-[4-(methylthio)phenyl]-2-morpholine-1-propanone [photopolymerization inititator (Ciba-Geigy, IRGACURE 907] | 7.1 |
| Diethylthioxanthone (photosensitizer) | 2.4 |
| Butylhydroxy toluene (polymerization inhibitor) | 0.1 |

EXAMPLE 1

Fifty four grams of the dispersion M1 were added to 200 g of the aqueous emulsion EM01 (white, semi-transparent). After agitating mildly, it was let stand at temperatures shown in Table 1. Although the color of the dispersion immediately after mixing was milky white, the dispersion (M1) of the unsaturated compound was absorbed completely in the emulsion particles after letting stand at room temperature for 30 minutes, and it became white and semi-transparent like the original aqueous emulsion. This solution did not separate into phases after standing and remained stable for a long period of time.

Then, this solution was coated on a copper-lined substrate so that the thickness after drying would be about 15 μm, and it was dried in an oven at 80° C. for 5 minutes, to obtain a clear and uniform coated film. This substrate was exposed to ultraviolet ray (UV) of 200 mJ/cm$^2$ through a negative mask. Later, when it was developed by spraying with 1% aqueous sodium carbonate solution for 30 seconds, an image having a line-and-space pattern of 50 μm/50 μm was obtained.

EXAMPLE 2

Dispersion M4 was mixed with the aqueous emulsion EM01 at the solid weight ratio of 65/35, and it was set in an oven at 70° C. to allow the dispersion of the compound to absorb in the emulsion particles. After 5 minutes, the dispersion of the compound was absorbed completely by the aqueous emulsion particles, and it became white and semi-transparent like the original aqueous emulsion. This solution was treated by the method of Example 1, to obtain an image having a line-and-space pattern of 50 μm/50 μm.

31 g of the Part A1 were added, and they were agitated vigorously, to disperse the unsaturated compound. As it was agitated at room temperature for 30 minutes, the unsaturated compound was absorbed in the emulsion particles of polymeric compound, to obtain a semi-transparent solution. It was treated by the procedure similar to Example 1, to obtain an image having a line-and-space pattern of 50 μm/50 μm.

Comparative Example 1

Thirty one grams of the Part A (of Example of Synthesis 1) were added to 200 g of the aqueous emulsion EM01, and they were agitated vigorously, and then it was let stand. Because the unsaturated compound was not absorbed by the emulsion particles and separated into phases after several minutes, it could not be used for coating.

Comparative Example 2

Thirty one grams of the Part A1 (of Example of Synthesis 8) were added to 200 g of the aqueous emulsion EM01' and agitated vigorously before it was let stand. Because the compound having at least one ethylenic unsaturated bond was not absorbed by the emulsion particles and separated into phases after several minutes, it could not be used for coating.

TABLE 1

|  | Aqueous emulsion used | Dispersion of unsaturated compound used | Weight ratio of solid in aqueous emulsion/solid in unsaturated compound dispersion | Absorbing time 25° C. | Absorbing time 70° C. | Absorbing time 100° C. | Appearance of film after drying | Line & space μm/μm |
|---|---|---|---|---|---|---|---|---|
| Example 1 | EM01 | M1 | 65/35 | 30 min. | 6 min. | 3 min. | Clear and uniform | 50/50 |
| Example 2 | EM01 | M4 | 65/35 | — | 5 min. |  | Clear and uniform | 50/50 |
| Example 3 | EM05 | M4 | 65/35 | — | 5 min. |  | Clear and uniform | 50/50 |
| Example 4 | EM01 | Part A1 | 65/35 | 30 min. |  |  | Clear and uniform | 50/50 |
| Comp. Example 1 | EM01 | Part A1 | 65/35 | Phase separation | | | — |  |
| Comp. Example 2 | EM01' | Part A1 | 65/35 | Phase separation | | | — |  |

EXAMPLE 3

Procedure of Example 2 was repeated, except using EM05 as the aqueous emulsion, to obtain a solution where the dispersion M4 was absorbed in the emulsion particles. This solution was treated by the method of Example 1, to obtain an image having a line-and-space pattern of 50 μm/50 μm.

EXAMPLE 4

0.54 g each of the polyethyleneglycol nonylphenyl ether and sodium dodecylbenzene sulfonate was added as the surfactant to 200 g of the aqueous emulsion EM01, and then

EXAMPLES 5–12

Various dispersions of unsaturated compounds and aqueous emulsions were mixed by the method of Example 1, by alternating the ratio in a manner shown in Table 2. Although each became milky white immediately after mixing, the dispersion of the unsaturated compound was absorbed completely into the emulsion particles within 20 minutes after standing at 25° C., to become white and semitransparent like the original aqueous emulsion. These solutions were coated on copper-lined substrates, and dried at 80° C. for 5 minutes. A transparent and uniform coated film was formed on the substrates. Results are shown in Table 2.

TABLE 2

|  | Aqueous emulsion used | Dispersion of unsaturated compound used | Weight ratio of solid in aqueous emulsion/solid in unsaturated compound dispersion | Time of Absorption (25° C.) | Appearance of film after drying |
|---|---|---|---|---|---|
| Example 5 | EM02 | M1 | 65/35 | 20 min. | Clear and uniform |
| Example 6 | EM03 | M1 | 65/35 | 5 min. | Clear and uniform |
| Example 7 | EM03 | M1 | 65/35 | 5 min. | Clear and uniform |
| Example 8 | EM04 | M1 | 85/15 | 3 min. | Clear and uniform |
| Example 9 | EM04 | M1 | 65/35 | 10 min. | Clear and uniform |
| Example 10 | EM04 | M2 | 85/15 | 10 min. | Clear and uniform |
| Example 11 | EM04 | M3 | 85/15 | 20 min. | Clear and uniform |
| Example 12 | EM06 | M1 | 65/35 | 20 min. | Clear and uniform |

We claim:

1. A process for preparing a waterborne photosensitive resin composition, that can form a photosensitive article developable with aqueous alkali solution, the process comprising, (1) making a mixture consisting essentially of an unsaturated compound (b) with a photoinitiator (c), (2) adding to an aqueous polymer emulsion (a), the mixture of compound (b) and photoinitiator (c) and a surfactant, and (3) agitating under conditions sufficient to absorb compound (b) into the polymeric particles of emulsion (a), to form a stable waterborne photosensitive resin composition, wherein said emulsion (a) consists essentially of an unneutralized aqueous emulsion of a polymer compound having an acid value of about 80–250 mg-KOH/g and a glass transition temperature of about 50°–200° C. and having at least one carboxyl group, and wherein said compound (b) is a compound having at least one ethylenically unsaturated bond, and wherein said photoinitiator (c) is a photoinitiator capable of generating free radicals by irradiation with actinic light.

2. A waterborne photosensitive resin composition made by the process of claim 1.

3. A process for preparing a waterborne photosensitive resin composition, that can form a photosensitive article developable with aqueous alkali solution, the process comprising, (1) making a mixture consisting essentially of an unsaturated compound (b) with a photoinitiator (c), (2) dispersing the mixture of compound (b) and photoinitiator (c) in water with a surfactant, (3) adding to an aqueous polymer emulsion (a), the mixture of compound (b) and photoinitiator (c) and a surfactant, and (4) agitating under conditions sufficient to absorb compound (b) into the polymeric particles of emulsion (a), to form a stable waterborne photosensitive resin composition, wherein said emulsion (a) consists essentially of an unneutralized aqueous emulsion of a polymer compound having an acid value of about 80–250 mg-KOH/g and a glass transition temperature of about 50°–200° C. and having at least one carboxyl group, and wherein said compound (b) is a compound having at least one ethylenically unsaturated bond, and wherein said photoinitiator (c) is a photoinitiator Capable of generating free radicals by irradiation with actinic light.

4. A waterborne photosensitive resin composition made by the process of claim 3.

* * * * *